United States Patent
Hsu et al.

(10) Patent No.: US 10,209,743 B1
(45) Date of Patent: Feb. 19, 2019

(54) FLEXIBLE DISPLAY DEVICE WITH POSITIONING MECHANISM

(71) Applicant: FOSITEK CORPORATION, New Taipei (TW)

(72) Inventors: An-Szu Hsu, New Taipei (TW); Way-Han Dai, New Taipei (TW); Chun-Han Lin, New Taipei (TW)

(73) Assignee: FOSITEK CORPORATION, New Taipei (TW)

( * ) Notice: Subject to any disclaimer, the term of this patent is extended or adjusted under 35 U.S.C. 154(b) by 0 days.

(21) Appl. No.: 16/036,986

(22) Filed: Jul. 17, 2018

(30) Foreign Application Priority Data

Mar. 7, 2018 (TW) .............................. 107202958 U

(51) Int. Cl.
*G06F 1/16* (2006.01)
*H05K 7/20* (2006.01)

(52) U.S. Cl.
CPC .......... *G06F 1/1652* (2013.01); *G06F 1/1681* (2013.01); *H05K 7/20954* (2013.01)

(58) Field of Classification Search
CPC ..... G06F 1/1616; G06F 1/1652; G06F 1/1681
See application file for complete search history.

(56) References Cited

U.S. PATENT DOCUMENTS

| | | | | |
|---|---|---|---|---|
| 9,506,279 | B2 * | 11/2016 | Kauhaniemi | G06F 1/1652 |
| 9,818,961 | B2 * | 11/2017 | Hiroki | H01L 51/0097 |
| 9,898,051 | B2 * | 2/2018 | Cho | G06F 1/1616 |
| 9,927,841 | B2 * | 3/2018 | Gheorghiu | G06F 1/1652 |
| 2007/0117600 | A1 * | 5/2007 | Robertson, Jr. | H04M 1/0216 455/575.3 |
| 2014/0174226 | A1 * | 6/2014 | Hsu | E05D 3/122 74/98 |
| 2014/0196253 | A1 * | 7/2014 | Song | G06F 1/1601 16/225 |
| 2014/0196254 | A1 * | 7/2014 | Song | E05D 3/14 16/302 |
| 2014/0217875 | A1 * | 8/2014 | Park | H05K 5/0226 312/326 |
| 2014/0226275 | A1 * | 8/2014 | Ko | G06F 1/1626 361/679.27 |
| 2015/0077917 | A1 * | 3/2015 | Song | G06F 1/1652 361/679.27 |
| 2015/0277506 | A1 * | 10/2015 | Cheah | G06F 1/1681 361/679.27 |
| 2015/0370287 | A1 * | 12/2015 | Ko | G06F 1/1626 361/749 |
| 2016/0132076 | A1 * | 5/2016 | Bitz | G06F 1/1681 361/679.27 |
| 2016/0224072 | A1 * | 8/2016 | Huang | E05D 7/06 |

* cited by examiner

*Primary Examiner* — Adrian S Wilson
(74) *Attorney, Agent, or Firm* — Burris Law, PLLC

(57) ABSTRACT

A flexible display device includes a base support of structurally flexible, a flexible display which is supported by and bendable with the base support, and at least one positioning mechanism disposed leftward or rightward of the base support. The positioning mechanism includes two mounts which are mounted to two support plates of the base support, a plurality of hinge bodies which are structurally flexible with a support rib unit of the base support, and a leaf spring unit extending through inside of the hinge bodies to terminate at a first spring end secured in one of the mounts, and a second spring end which is releasably and frictionally engaged inside the other one of the mounts by virtue of a sliding block and a spring-loaded unit.

10 Claims, 10 Drawing Sheets

FLEXIBLE DISPLAY DEVICE WITH POSITIONING MECHANISM

CROSS-REFERENCE TO RELATED APPLICATION

This application claims priority from Taiwanese utility model patent application no. 107202958, filed on Mar. 7, 2018.

FIELD

The disclosure relates to a flexible display device, more particularly to a flexible display device including at least one positioning mechanism.

BACKGROUND

With development of a flexible display for a smart phone, a tablet computer, etc., a support is provided for supporting such flexible display in a flat state or a bent state. A conventional support may include two support plates for supporting two opposite segments of the flexible display, and the support plates may be connected by a plurality of hinge members or other else to permit the support plates to be angularly movable relative to each other so as to allow the flexible display to be bendable with the support. Thus, there is a need to provide a positioning mechanism for positioning an angular relationship between the support plates.

SUMMARY

Therefore, an object of the disclosure is to provide a novel flexible display device with a positioning mechanism.

According to the disclosure, a flexible display device includes a base support, a flexible display, and at least one positioning mechanism. The base support includes a first support plate extending lengthwise to terminate at a left end and a right end, a second support plate extending lengthwise to terminate at a left end and a right end, and a support rib unit including a plurality of support ribs which are juxtaposed to each other, and which are configured to be associated with each other to permit the support rib unit to be structurally flexible. The support rib unit is flanked by and configured to loosely interconnect the first and second support plates so as to permit the base support to be structurally flexible between a normal position and a bent position. Each of the support ribs extends lengthwise to terminate at a left end and a right end. The flexible display is supported by the base support to be bendable with the base support. The positioning mechanism is disposed leftward or rightward of the base support, and which includes a first mount, a second mount, a plurality of hinge bodies, a leaf spring unit, a sliding block, and a spring-loaded unit. The first mount is mounted to a corresponding one of the left and right ends of the first support plate to permit the first mount to move with the first support plate, and includes a camming wall with a camming surface, and an abutment wall that is spaced apart from the camming wall to define a first cavity. The second mount is mounted to a corresponding one of the left and right ends of the second support plate to permit the second mount to move with the second support plate, and defines therein a second cavity. The hinge bodies are chained to each other along a chain line. Each of the hinge bodies has a through bore and is configured to be in interference engagement with a corresponding one of the left and right ends of the respective support rib so as to permit the hinge bodies to be structurally flexible with the support rib unit. The through bores of the hinge bodies are arranged in tandem along the chain line. Each of the hinge bodies has a cover wall, and a base wall which is spaced apart from the cover wall to define the through bore, and which has a floor segment and an elevated cantilever segment. The base wall is configured to permit the elevated cantilever segment of one of the hinge bodies to overlie and to slidably engage with the floor segment of an adjacent one of the hinge bodies. The leaf spring unit extends along the chain line to pass through the through bores of the hinge bodies to terminate at a first spring end which is to be disposed in the first cavity, and a second spring end secured in the second cavity. The sliding block is fitted in the first cavity, and is slidable from a distal position corresponding to the normal position, to a proximate position corresponding to the bent position. The sliding block has a retaining segment distal from the second mount, and a securing segment which is proximate to the second mount, and which is configured to secure the first spring end thereto. The retaining segment has a first segment wall and a second segment wall. The first segment wall confronts the camming wall, and has a first opening. The second segment wall confronts the abutment wall, and is spaced apart from the first segment wall to define an accommodation space. The spring-loaded unit is disposed in the accommodation space, and includes a pin stem and a biasing member. The pin stem is disposed in the accommodation space, and extends through the first opening to terminate at a first stem end. The biasing member is disposed to bias the first stem end into frictional engagement with the camming surface of the camming wall such that once a force applied to move the sliding block against a biasing force of the biasing member between the distal and proximate positions ceases to be applied, the sliding block is kept retained between the distal and proximate positions.

BRIEF DESCRIPTION OF THE DRAWINGS

Other features and advantages of the disclosure will become apparent in the following detailed description of the embodiment(s) with reference to the accompanying drawings, in which.

DETAILED DESCRIPTION

Figure 1:
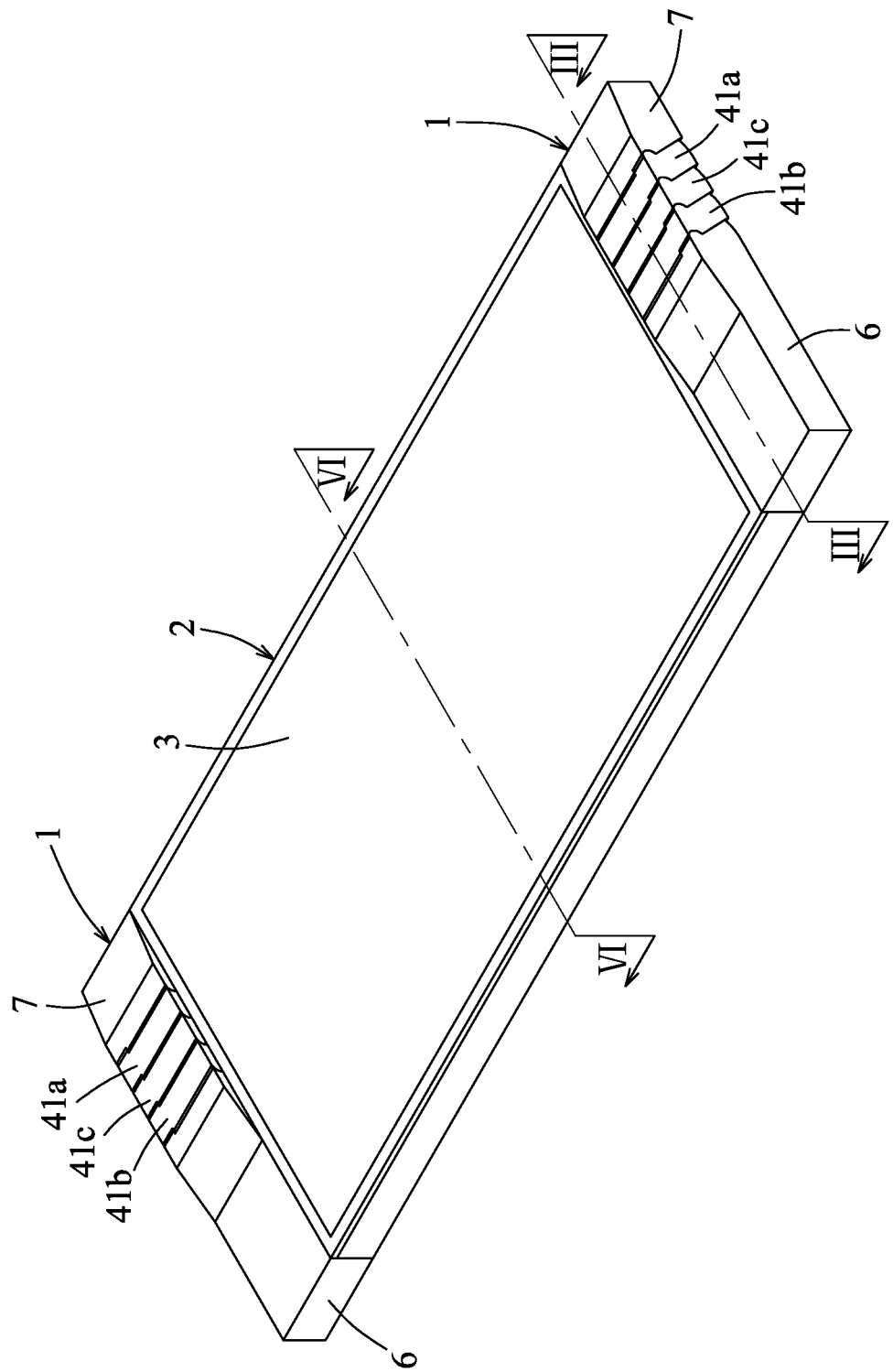
FIG. 1 is a perspective view of a flexible display device according to an embodiment of the disclosure.

Before the disclosure is described in greater detail, it should be noted that where considered appropriate, reference numerals have been repeated among the figures to indicate corresponding or analogous elements, which may optionally have similar characteristics.

To aid in describing the disclosure, directional terms may be used in the specification and claims to describe portions of the present disclosure (e.g., front, rear, left, right, top, bottom, etc.). These directional definitions are intended to merely assist in describing and claiming the disclosure and are not intended to limit the disclosure in any way.

Figure 2:
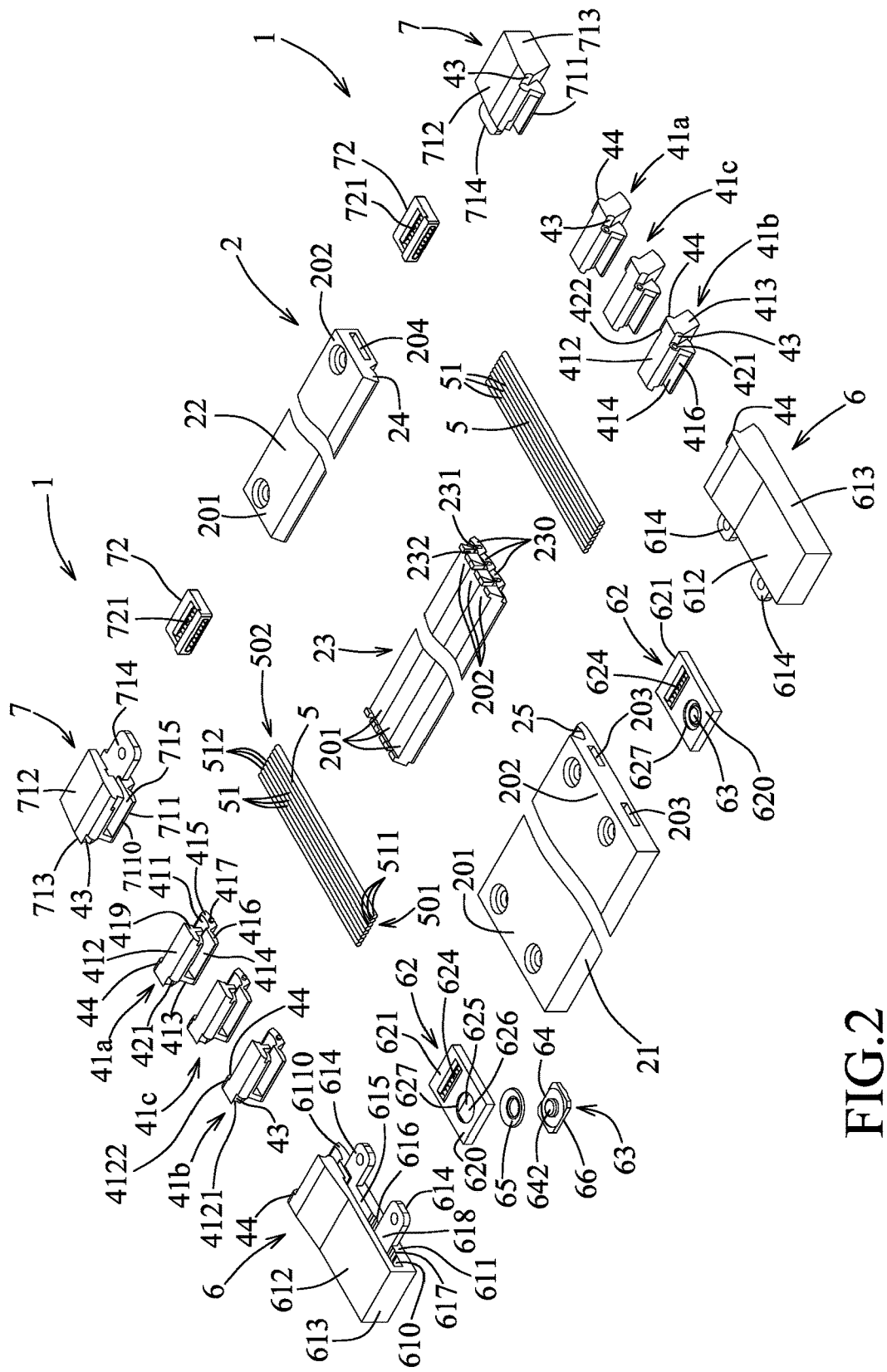
FIG. 2 is an exploded perspective view of the flexible display device in which a flexible display is omitted.

Referring to FIGS. 1 and 2, a flexible display device according to an embodiment of the disclosure is shown to include at least one positioning mechanism 1, a base support 2, and a flexible display 3.

The base support 2 includes a first support plate 21, a second support plate 22, and a support rib unit 23.

The first support plate 21 extends lengthwise to terminate at a left end 201 and a right end 202. As shown in FIG. 2, each of the left and right ends 201, 202 of the first support plate 21 may be formed with two slots 203.

The second support plate 22 extends lengthwise to terminate at a left end 201 and a right end 202. As shown in FIG. 2, each of the left and right ends 201, 202 of the second support plate 22 may be formed with a slot 204.

Figure 9:
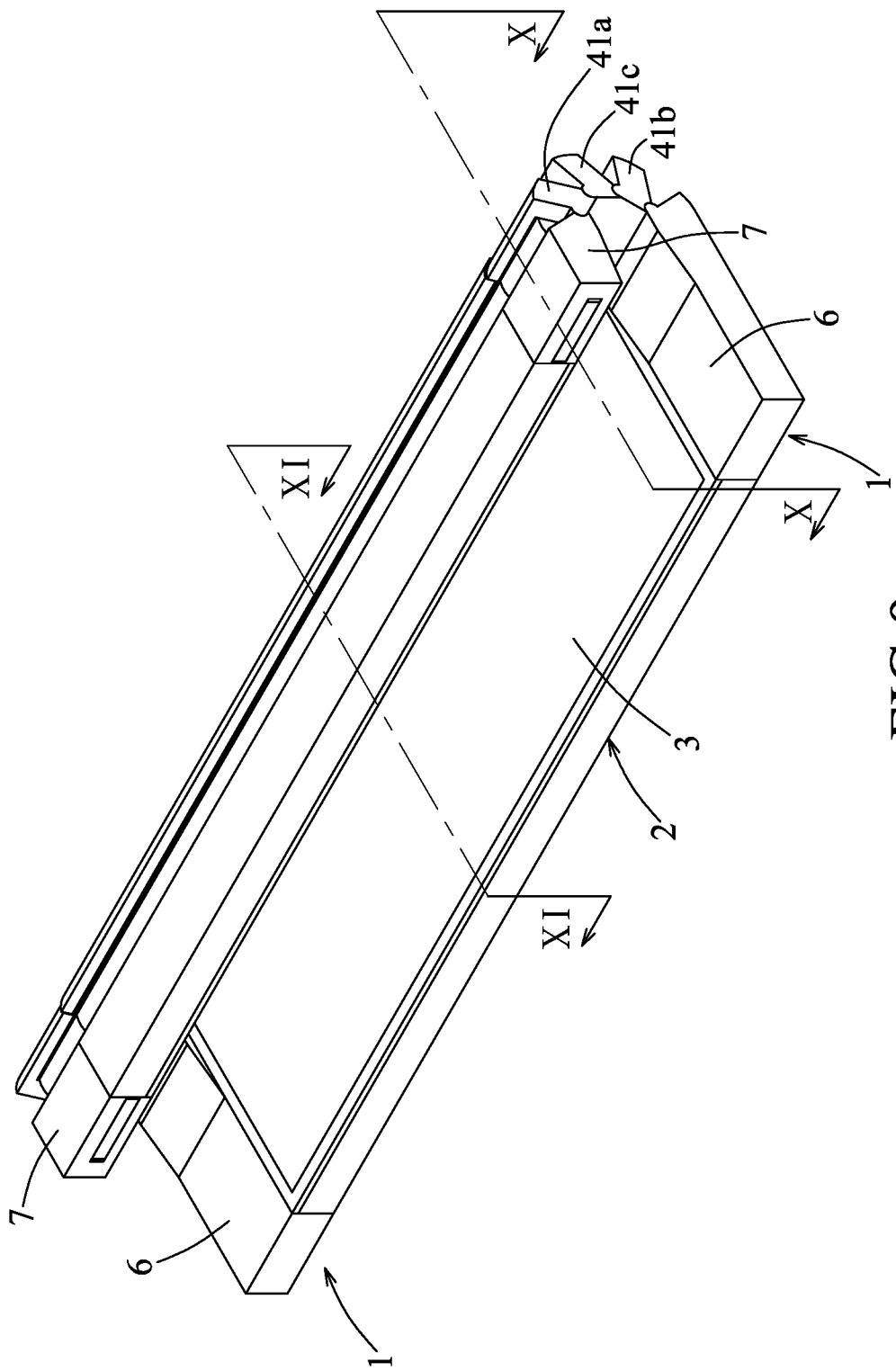
FIG. 9 is similar to FIG. 7 but illustrating the base support in a second bent position.
Figure 11:
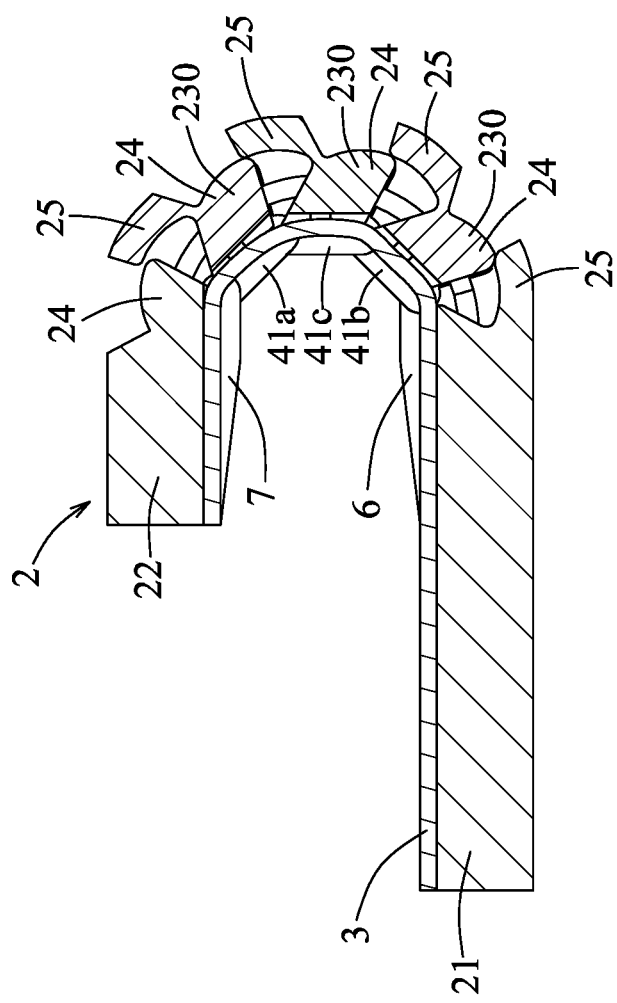
FIG. 11 is a cross-sectional view taken along line XI-XI of FIG. 9.

The support rib unit 23 includes a plurality of support ribs 230 which are juxtaposed to each other, and which are configured to be associated with each other to permit the support rib unit 23 to be structurally flexible. The support rib unit 23 is flanked by the first and second support plates 21, 22, and is configured to loosely interconnect the first and second support plates 21, 22 so as to permit the base support 2 to be structurally flexible between a normal position (FIGS. 1 and 6) and a bent position (FIGS. 7, 9, and 11). Each of the support ribs 230 extends lengthwise to terminate at a left end 201 and a right end 202.

Figure 5:
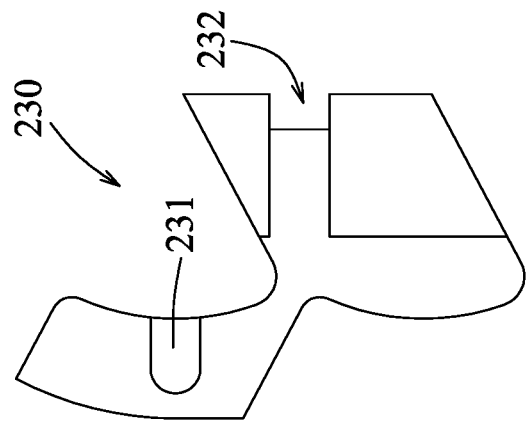
FIG. 5 is an enlarged side view of a support rib of the flexible display device.

In an embodiment shown in FIGS. 2 and 5, each of the left and right ends 201, 202 of the support ribs 230 may be formed with a pin hole 231 and an indentation 232.

In an embodiment, a flexible circuit board (not shown) carried with electronic components may be secured to the base support 2.

The flexible display 3 is supported by the base support 2 to be bendable with the base support 2. In an embodiment, the flexible display 3 may be a screen of a smart phone, a tablet computer, or the like. Furthermore, the flexible display 3 may be formed using flexible organic light-emitting diode display technology. The flexible display 3 may be attached to the first and second support plates 21, 22 using a suitable adhesive.

Figure 3:
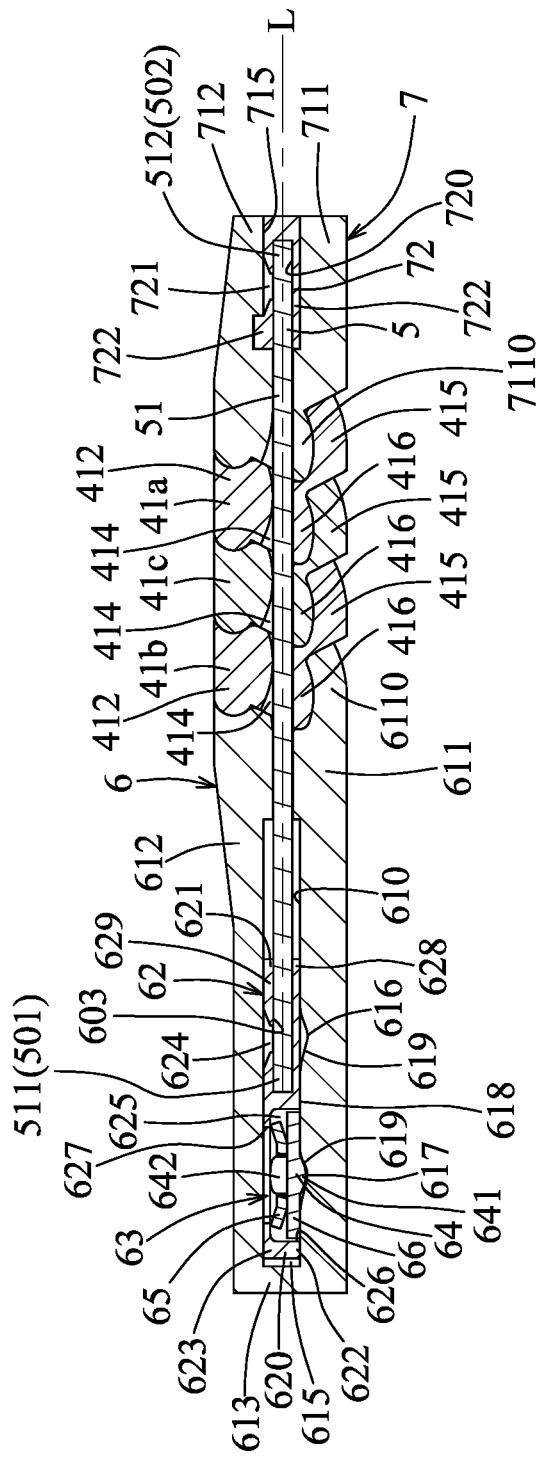
FIG. 3 is a cross-sectional view taken along line III-III of FIG. 1.

As shown in FIGS. 1 to 3, the positioning mechanism 1 is disposed leftward or rightward of the base support 2, and includes a first mount 6, a second mount 7, a plurality of hinge bodies 41a, 41b, 41c, a leaf spring unit 5, a sliding block 62, and a spring-loaded unit 63.

The first mount 6 is mounted to a corresponding one of the left and right ends 201, 202 of the first support plate 21 to permit the first mount 6 to move with the first support plate 21. In addition, the first mount 6 includes a camming wall 611 with a camming surface 610, and an abutment wall 612 that is spaced apart from the camming wall 611 to define a first cavity 615.

In an embodiment shown in FIGS. 2 and 3, the first mount 6 may further include a lateral wall 613 and two protrusions 614. The lateral wall 613 interconnects the camming wall 611 and the abutment wall 612. The two protrusions 614 extend from the camming wall 611 to be fittingly and respectively inserted into the slots 203 of the corresponding one of the left and right ends 201, 202 of the first support plate 21 so as to permit the first mount 6 to be mounted to the first support plate 21.

The second mount 7 is mounted to a corresponding one of the left and right ends 201, 202 of the second support plate 22 to permit the second mount 7 to move with the second support plate 22. In addition, the second mount 7 defines therein a second cavity 715.

In an embodiment shown in FIGS. 2 and 3, the second mount 7 may include a base mount wall 711, a cover mount wall 712, a lateral wall 713, and a protrusion 714. The base mount wall 711, the cover mount wall 712, and the lateral wall 713 cooperatively define the second cavity 715. The protrusion 714 may be fittingly inserted into the slot 204 of the corresponding one of the left and right ends 201, 202 of the second support plate 22 so as to permit the second mount 7 to be mounted to the second support plate 22.

The hinge bodies 41a, 41b, 41c are chained to each other along a chain line (L), as shown in FIG. 3. Each of the hinge bodies 41a, 41b, 41c has a through bore 414 and is configured to be in interference engagement with a corresponding one of the left and right ends 201, 202 of the respective support rib 230 so as to permit the hinge bodies 41a, 41b, 41c to be structurally flexible with the support rib unit 23. The through bores 414 of the hinge bodies 41a, 41b, 41c are arranged in tandem along the chain line (L). As shown in FIG. 2, each of the hinge bodies 41a, 41b, 41c has a cover wall 412 and a base wall 411.

The base wall 411 is spaced apart from the cover wall 412 to define the through bore 414, and has a floor segment 415 and an elevated cantilever segment 416. The base wall 411 is configured to permit the elevated cantilever segment 416 of one of the hinge bodies 41a, 41b, 41c to overlie and to slidably engage with the floor segment 415 of an adjacent one of the hinge bodies 41a, 41b, 41c.

In an embodiment shown in FIGS. 2 and 3, the camming wall 611 may have an end segment 6110 with a configuration similar to the floor segment 415 so as to permit the elevated cantilever segment 416 of the hinge body 41b to overlie and to slidably engage with the end segment 6110. The base mount wall 711 may have an end segment 7110 with a configuration similar to the elevated cantilever segment 416 so as to permit the end segment 7110 to overlie and to slidably engage with the floor segment 415 of the hinge body 41a.

Figure 4:
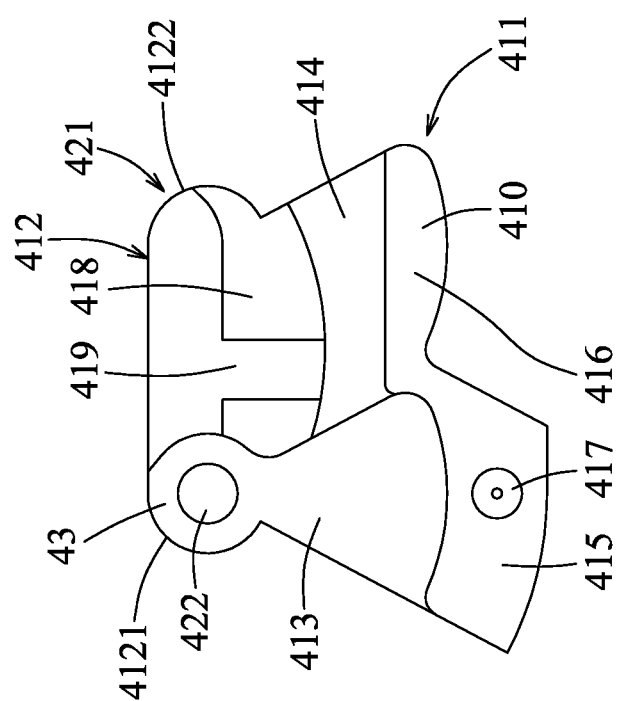
FIG. 4 is an enlarged side view of a hinge body of the flexible display device.

In an embodiment shown in FIGS. 2 and 4, the cover wall 412 has a first wall end 4121 confronting the first mount 6, and a second wall end 4122 confronting the second mount 7. The first and second wall ends 4121, 4122 are configured to permit the first wall end 4121 of one of the hinge bodies 41a, 41b, 41c to be hinged to the second wall end 4122 of an adjacent one of the hinge bodies 41a, 41b, 41c so as to guide sliding movement of the elevated cantilever segment 416 relative to the corresponding floor segment 415.

In an embodiment shown in FIGS. 2 and 4, the first wall end 4121 has an indentation 43 formed with a hinge hole 421, and a second wall end 4122 has a protuberance 44 which is configured to rotatably fit with the indentation 43, and which is formed with a hinge pin 422 that is rotatably received in the corresponding hinge hole 421.

Furthermore, as shown in FIG. 2, a marginal segment of the abutment wall 612 may be formed with a protuberance 44 for hingedly connecting the indentation 43 of the hinge body 41b. A marginal segment of the cover mount wall 712 may be formed with an indentation 43 for hingedly connecting the protuberance 44 of the hinge body 41a.

In an embodiment shown in FIGS. 2 to 4, each of the hinge bodies 41a, 41b, 41c further has a lateral wall 413 interconnecting the cover wall 412 and the base wall 411 for bordering the through hole 414. The cover wall 412 extends from the lateral wall 413 toward the respective support rib 230 to terminate at a cover wall end 418 formed with a T-shaped protrusion 419 as shown in FIG. 4. The base wall 411 extends from the lateral wall 413 toward the respective support rib 230 to terminate at a base wall end 410 formed with a pin 417. The pin 417 and the T-shaped protrusion 419 are respectively configured to be fitted in the corresponding pin hole 231 and the corresponding indentation 232 so as to permit each of the hinge bodies 41a, 41b, 41c to be in interference engagement with the corresponding one of the left and right ends 201, 202 of the respective support rib 230.

Although the positioning mechanism 1 includes three hinge bodies 41a, 41b, 41c in the embodiment shown in FIGS. 1 to 3, the number of the hinge bodies may be varied based on the dimension of the flexible display 3 in other embodiments.

Figure 6:
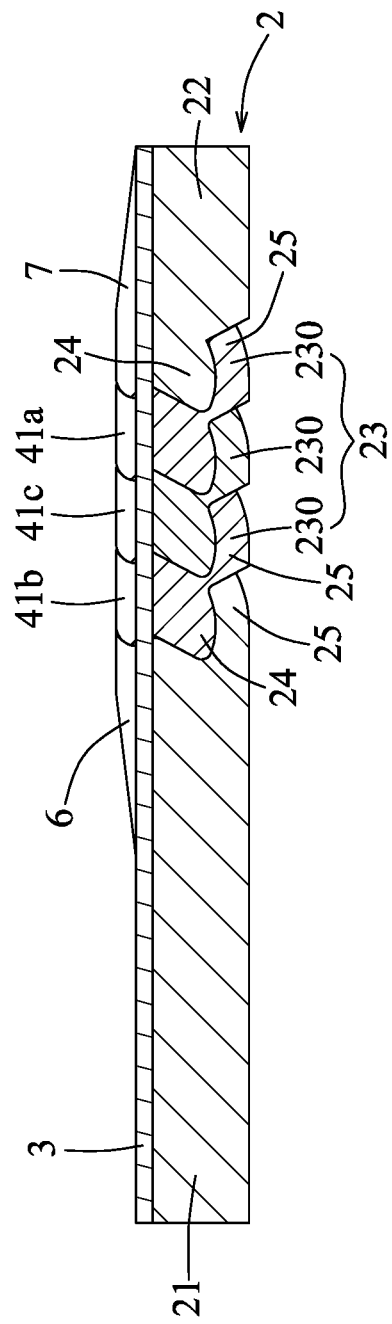
FIG. 6 is a cross-sectional view taken along line VI-VI of FIG. 1.
Figure 7:
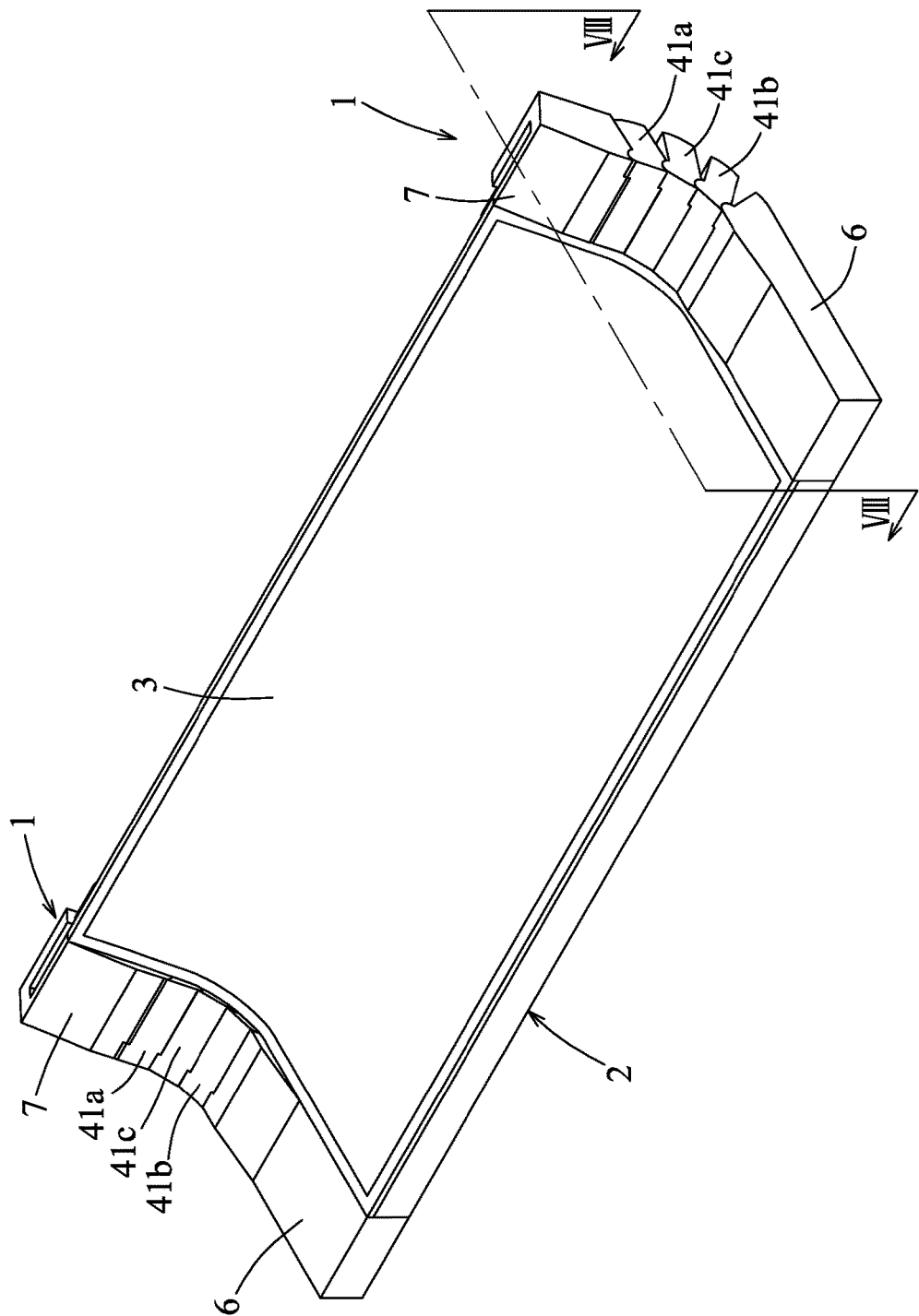
FIG. 7 is similar to FIG. 1 but illustrating a base support in a first bent position.
Figure 10:
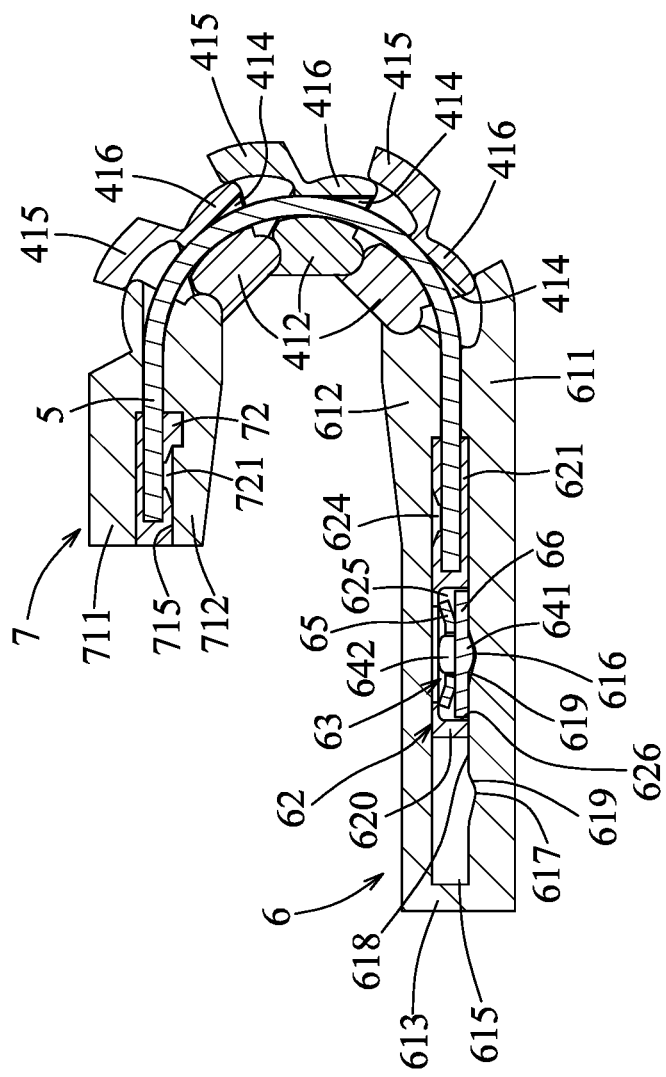
FIG. 10 is a cross-sectional view taken along line X-X of FIG. 9.

In an embodiment shown in FIGS. 2, 6, and 10, the first support plate 21, the second support plate 22, and the support ribs 230 are loosely connected to each other by virtue of elevated cantilever segment 24 and the floor segments 25 similar to the elevated cantilever segments 416 and the floor segments 415.

The leaf spring unit 5 is non-stretchable, and extends along the chain line (L) to pass through the through bores 414 of the hinge bodies 41a, 41b, 41c to terminate at a first spring end 501 which is to be disposed in the first cavity 615, and a second spring end 502 secured in the second cavity 715.

In an embodiment shown in FIGS. 2, 3, 8, and 10, the leaf spring unit 5 has an outer dimension slightly smaller than an inner dimension of the through bore 414 of each of the hinge bodies 41a, 41b, 41c, so as to permit the leaf spring unit 5 to be frictionally engaged inside the hinge bodies 41a, 41b, 41c.

The sliding block 62 is fitted in the first cavity 615, and is slidable from a distal position corresponding to the normal position, to a proximate position corresponding to the bent position. The sliding block 62 has a retaining segment 620 distal from the second mount 7, and a securing segment 621 proximate to the second mount 7. The securing segment 621 is configured to secure the first spring end 501 thereto. The retaining segment 620 has a first segment wall 622 and a second segment wall 623. The first segment wall 622 confronts the camming wall 611, and has a first opening 626. The second segment wall 623 confronts the abutment wall 612, and is spaced apart from the first segment wall 622 to define an accommodation space 625.

The sliding block 62 is biased by the leaf spring unit 5 toward the distal position (FIG. 3).

The spring-loaded unit 63 is disposed in the accommodation space 625, and includes a pin stem 64 and a biasing member 65.

The pin stem 64 is retained in the accommodation space 625, and extends through the first opening 626 to terminate at a first stem end 641.

The biasing member 65 is disposed to bias the first stem end 641 into frictional engagement with the camming surface 610 of the camming wall 611 such that once a force applied to move the sliding block 62 against a biasing force of the biasing member 65 between the distal and proximate positions ceases to be applied, the sliding block 62 is kept retained between the distal and proximate positions.

In an embodiment shown in FIG. 3, the camming surface 610 has a distal region 617, a proximate region 616, and an intermediate region 618.

The distal region 617 is configured to be in frictional engagement with the first stem end 641 when the sliding block 62 is in the distal position (FIG. 3) and the base support 2 is in the normal position (FIG. 1). In this case, the first and second support plates 21, 22 may define an included angle of about 180°.

The intermediate region 618 is disposed between the distal and proximate regions 617, 616, and is configured to be in frictional engagement with the first stem end 641 when the sliding block 62 is in an intermediate position (FIG. 8) between the distal and proximate positions, and the base support 2 is in a first bent position (FIG. 7). In this case, the first and second support plates 21, 22 may define an included angle less than 180°.

The proximate region 616 is configured to be in frictional engagement with the first stem end 641 when the sliding block 62 is in the proximate position (FIG. 10), and the base support 2 is in a second bent position (FIG. 9). In this case, the second support plate 22 is disposed above and substantially parallel to the first support plate 21.

In an embodiment, the sliding block 7 may be continuously kept in any positions between the distal region 617 and the proximate region 616 so as to continuously bend the base support 2 from the normal position (FIGS. 1 and 6), through the first bent position (FIG. 7), to the second bent position (FIGS. 9 and 11).

Figure 8:
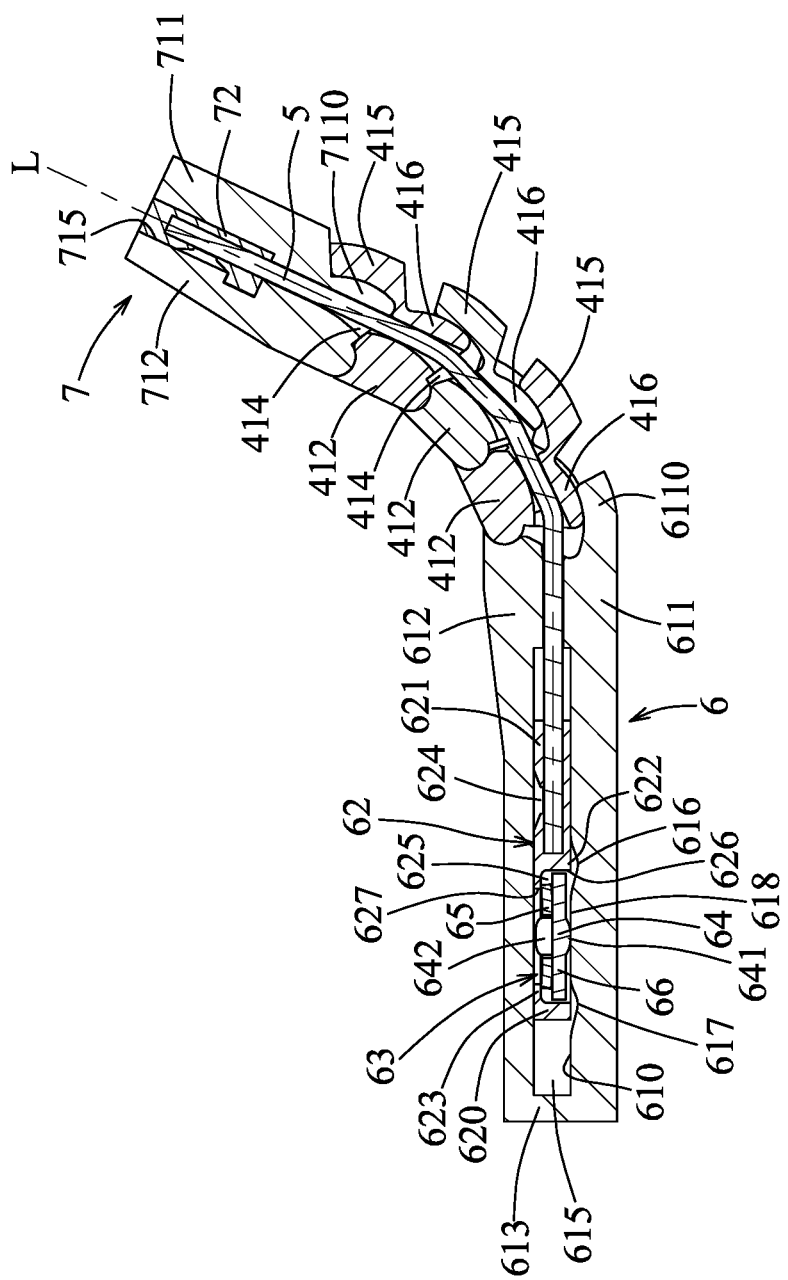
FIG. 8 is a cross-sectional view taken along line VIII-VIII of FIG. 7.

In an embodiment, the distal region 617 has a first depression. The biasing member 65 is configured to be transformable between a first state and a second state with a larger biasing force than the first state. In the first state, as shown in FIG. 3, the first stem end 641 is engaged in the first depression 617. In the second state, as shown in FIG. 8, the first stem end 641 is kept in frictional engagement with the intermediate region 618. In response to displacement of the sliding block 62 to the intermediate position (FIG. 8), the biasing member 65 is transformed to the second state so as to have a larger frictional force between the sliding block 62 and the first mount 6 to ensure the sliding block 62 be kept in the intermediate position.

In an embodiment shown in FIG. 3, the proximate region 616 has a second depression configured such that in response to displacement of the sliding block 62 to the proximate position (FIG. 10), the first stem end 641 is engaged in the second depression 616 to thereby permit the biasing member 65 to be transformed to the first state.

In an embodiment shown in FIG. 3, the first stem end 641 is rounded to mate with the first depression 617 so as to facilitate relative movement between the pin stem 64 and the first depression 617, and to mate with the second depression 616 so as to facilitate relative movement between the pin stem 64 and the second depression 616.

In an embodiment shown in FIG. 3, each of the first and second depressions 617, 616 has a ramp 619 sloping downwardly the camming surface 610 for mating with the first stem end 641.

In an embodiment shown in FIG. 3, the spring-loaded unit 63 further includes a flange 66 which extends radially from the pin stem 64 in proximity to the first stem end 641 and which is disposed beneath the biasing member 65 so as to permit the first stem end 641 to be biased into frictional engagement with the camming surface 610.

In an embodiment shown in FIGS. 2 and 3, the biasing member 65 is a spring washer, and is sleeved on the pin stem 64. The spring washer 65 is configured to be curved such that in response to displacement of the sliding block 62 to the intermediate position (FIG. 8), the spring washer 65 is pressed by the flange 66 so as to be squeezed between the flange 66 and the second segment wall 623 to thereby be transformed to the second state.

In an embodiment shown in FIG. 3, the second segment wall 623 has a second opening 627 in alignment with the first opening 626, and the pin stem 64 further has a second stem end 642 which is opposite to the first stem end 641, and which is configured to be brought into frictional engagement with the abutment wall 612, through the second opening 627, when the sliding block 62 is displaced to the intermediate position (FIG. 8) so as to increase a friction area between the pin stem 64 and the first mount 6.

In an embodiment shown in FIGS. 2 and 3, the leaf spring unit 5 includes a plurality of juxtaposed metal wires 51 each extending parallel to the chain line (L) to terminate at a first wire end 511 and a second wire end 512. The first wire ends 511 of the metal wires 51 serve as the first spring end 501, and the second wire ends 512 of the metal wires 51 serve as the second spring end 502. The metal wires 51 may be steel wires or the like.

Furthermore, the securing segment 621 has a third segment wall 628 confronting the camming wall 611, and a fourth segment wall 629 which confronts the abutment wall 612, and which is spaced apart from the third segment wall 628 to define a first receiving space 603 for receiving the first wire ends 511 of the metal wires 51. The fourth segment wall 629 has a first access opening 624 configured to permit access of a welding material to the first receiving space 603 for fusion welding the first wire ends 511 to the securing segment 621.

Moreover, the positioning mechanism 1 further includes a securing block 72 which is configured to be secured in the second cavity 715, and which has two block walls 722 that are spaced apart from each other to define therebetween a second receiving space 720 for receiving the second wire ends 512 of the metal wires 51. One of the block walls 722 has a second access opening 721 configured to permit access of a welding material to the second receiving space 720 for fusion welding the second wire ends 512 to the securing block 72.

In other embodiments, the leaf spring unit 5 may be a metal strip or the like.

In an embodiment shown in FIGS. 1 and 2, the flexible display device includes two of the positioning mechanisms 1 which are disposed leftward and rightward of the base support 2, respectively.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment (s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A flexible display device comprising:
    a base support including
        a first support plate extending lengthwise to terminate at a left end and a right end,
        a second support plate extending lengthwise to terminate at a left end and a right end, and
        a support rib unit including a plurality of support ribs which are juxtaposed to each other, and which are configured to be associated with each other to permit said support rib unit to be structurally flexible, said support rib unit being flanked by and configured to loosely interconnect said first and second support plates so as to permit said base support to be structurally flexible between a normal position and a bent position, each of said support ribs extending lengthwise to terminate at a left end and a right end;
    a flexible display which is supported by said base support to be bendable with said base support; and
    at least one positioning mechanism which is disposed leftward or rightward of said base support, and which includes
        a first mount which is mounted to a corresponding one of said left and right ends of said first support plate to permit said first mount to move with said first support plate, and which includes a camming wall with a camming surface, and an abutment wall that is spaced apart from said camming wall to define a first cavity,
        a second mount which is mounted to a corresponding one of said left and right ends of said second support plate to permit said second mount to move with said second support plate, and which defines therein a second cavity,
        a plurality of hinge bodies which are chained to each other along a chain line, each of said hinge bodies having a through bore and being configured to be in interference engagement with a corresponding one of said left and right ends of said respective support rib so as to permit said hinge bodies to be structurally flexible with said support rib unit, said through bores of said hinge bodies being arranged in tandem along said chain line, each of said hinge bodies having
            a cover wall, and
            a base wall which is spaced apart from said cover wall to define said through bore, and which has a floor segment and an elevated cantilever segment, said base wall being configured to permit said elevated cantilever segment of one of said hinge bodies to overlie and to slidably engage with said floor segment of an adjacent one of said hinge bodies,
        a leaf spring unit extending along said chain line to pass through said through bores of said hinge bodies to terminate at a first spring end which is to be disposed in said first cavity, and a second spring end secured in said second cavity,
        a sliding block which is fitted in said first cavity, and which is slidable from a distal position corresponding to said normal position, to a proximate position corresponding to said bent position, said sliding block having a retaining segment distal from said second mount, and a securing segment which is proximate to said second mount, and which is configured to secure said first spring end thereto, said retaining segment having
  a first segment wall confronting said camming wall, and having a first opening, and
  a second segment wall which confronts said abutment wall, and which is spaced apart from said first segment wall to define an accommodation space, and
  a spring-loaded unit disposed in said accommodation space, and including
    a pin stem disposed in said accommodation space, and extending through said first opening to terminate at a first stem end, and
    a biasing member disposed to bias said first stem end into frictional engagement with said camming surface of said camming wall such that once a force applied to move said sliding block against a biasing force of said biasing member between said distal and proximate positions ceases to be applied, said sliding block is kept retained between said distal and proximate positions.

2. The flexible display device according to claim 1, wherein said camming surface has
  a distal region configured to be in frictional engagement with said first stem end when said sliding block is in said distal position,
  a proximate region configured to be in frictional engagement with said first stem end when said sliding block is in said proximate position, and
  an intermediate region disposed between said distal and proximate regions, and configured to be in frictional engagement with said first stem end when said sliding block is in an intermediate position between said distal and proximate positions.

3. The flexible display device according to claim 2, wherein
  said distal region has a first depression, and
  said biasing member is configured to be transformable between a first state, where said first stem end is engaged in said first depression, and a second state with a larger biasing force than said first state, where said first stem end is kept in frictional engagement with said intermediate region, such that in response to displacement of said sliding block to said intermediate position, said biasing member is transformed to said second state so as to have a larger frictional force between said sliding block and said first mount to ensure said sliding block be kept in said intermediate position.

4. The flexible display device according to claim 3, wherein said proximate region has a second depression configured such that in response to displacement of said sliding block to said proximate position, said first stem end is engaged in said second depression to thereby permit said biasing member to be transformed to said first state.

5. The flexible display device according to claim 4, wherein said first stem end is rounded to mate with said first depression so as to facilitate relative movement between said pin stem and said first depression.

6. The flexible display device according to claim 5, wherein said spring-loaded unit further includes a flange which extends radially from said pin stem in proximity to said first stem end, and which is disposed beneath said biasing member so as to permit said first stem end to be biased into frictional engagement with said camming surface.

7. The flexible display device according to claim 6, wherein said biasing member is a spring washer configured to be curved such that in response to displacement of said sliding block to said intermediate position, said spring washer is pressed by said flange so as to be squeezed between said flange and said second segment wall to thereby be transformed to said second state.

8. The flexible display device according to claim 6, wherein said second segment wall has a second opening in alignment with said first opening, and said pin stem further has a second stem end which is opposite to said first stem end, and which is configured to be brought into frictional engagement with said abutment wall, through said second opening, when said sliding block is displaced to said intermediate position so as to increase a friction area between said pin stem and said first mount.

9. The flexible display device according to claim 1, wherein
  said leaf spring unit includes a plurality of juxtaposed metal wires each extending parallel to said chain line to terminate at a first wire end and a second wire end, said first wire ends of said metal wires serving as said first spring end, said second wire ends of said metal wires serving as said second spring end,
  said securing segment has a third segment wall confronting said camming wall, and a fourth segment wall which confronts said abutment wall, and which is spaced apart from said third segment wall to define a first receiving space for receiving said first wire ends of said metal wires, said fourth segment wall having a first access opening configured to permit access of a welding material to said first receiving space for fusion welding said first wire ends to said securing segment, and
  said positioning mechanism further includes a securing block which is configured to be secured in said second cavity, and which has two block walls that are spaced apart from each other to define therebetween a second receiving space for receiving said second wire ends of said metal wires, one of said block walls having a second access opening configured to permit access of a welding material to said second receiving space for fusion welding said second wire ends to said securing block.

10. The flexible display device according to claim 1, wherein said cover wall has a first wall end confronting said first mount, and a second wall end confronting said second mount, said first and second wall ends being configured to permit said first wall end of one of said hinge bodies to be hinged to said second wall end of an adjacent one of said hinge bodies so as to guide sliding movement of said elevated cantilever segment relative to said corresponding floor segment.

* * * * *